United States Patent
Park et al.

[11] Patent Number: 5,817,561
[45] Date of Patent: Oct. 6, 1998

[54] INSULATED GATE SEMICONDUCTOR DEVICE AND METHOD OF MANUFACTURE

[75] Inventors: Heemyong Park, Gilbert; Vida Ilderem, Phoenix; Andreas A. Wild, Scottsdale, all of Ariz.

[73] Assignee: Motorola, Inc., Schaumburg, Ill.

[21] Appl. No.: 720,509

[22] Filed: Sep. 30, 1996

[51] Int. Cl.⁶ .................... H01L 21/336; H01L 21/3205
[52] U.S. Cl. ............................. 438/305; 438/596
[58] Field of Search ................... 438/231, 257, 438/286, 303, 307, 595, 305, 596

[56] References Cited

U.S. PATENT DOCUMENTS

| | | | |
|---|---|---|---|
| 4,994,904 | 2/1991 | Nakagawa et al. | |
| 5,063,172 | 11/1991 | Manley | 438/304 |
| 5,108,939 | 4/1992 | Manley et al. | |
| 5,146,291 | 9/1992 | Watabe et al. | 357/23.4 |
| 5,196,357 | 3/1993 | Boardman et al. | 438/304 |
| 5,213,989 | 5/1993 | Fitch et al. | 438/257 |
| 5,411,906 | 8/1995 | Burger | 438/286 |
| 5,459,091 | 10/1995 | Hwang | 438/257 |
| 5,489,548 | 2/1996 | Mishioka et al. | 438/257 |
| 5,541,132 | 7/1996 | Davies et al. | |
| 5,543,339 | 8/1996 | Roth et al. | 438/257 |
| 5,612,244 | 3/1997 | Davies et al. | 438/286 |

FOREIGN PATENT DOCUMENTS 3-289139   12/1991   Japan ..................... 438/177

*Primary Examiner*—John Niebling
*Assistant Examiner*—Michael S. Lebentritt
*Attorney, Agent, or Firm*—Kevin B. Jackson

[57] ABSTRACT

An insulated gate semiconductor device (10) has a double spacer gate structure (45). To form the gate structure (45), a stack having sidewalls (22) is formed over a major surface (12) of a semiconductor substrate (11). A gate oxide (23) is then formed over the major surface (12) adjacent the sidewalls (22). A first polysilicon layer (24) is deposited on the gate oxide (23) and the stack. The first polysilicon layer (24) is etched to form a first conductive spacer (32) of the gate structure (45). A second polysilicon layer (44) is deposited on first spacer (32) and the stack. The second polysilicon layer (44) is then etched to form a second conductive spacer (46) of the gate structure (45). Because the double spacer gate structure (45) is formed without relying on photolithographic techniques, its size is smaller than the size of a gate structure formed using conventional photolithography.

17 Claims, 12 Drawing Sheets

INSULATED GATE SEMICONDUCTOR DEVICE AND METHOD OF MANUFACTURE

BACKGROUND OF THE INVENTION

This invention relates, in general, to semiconductor devices and, more particularly, to semiconductor devices having features with sub-photolithographic dimensions.

With an ever increasing demand for smaller and more compact semiconductor devices having higher performance and less power consumption, manufacturers are incorporating designs that require sub-photolithographic features. For example, in metal oxide semiconductor field effect transistor (MOSFET) devices having sub-micron channel lengths, sub-micron features (e.g., doped regions having less than 0.4 micron dimensions) are being incorporated into the channel region between the source and drain regions to improve performance. These doped regions must have precise dimensions in order to fully achieve improved performance. In other words, variations in the dimensions of these features can detrimentally impact device performance.

Conventional lithographic techniques are inadequate to accurately and reproducibly form sub-micron features less than about 0.4 microns. Alternative methods for forming sub-micron features include phase shifting technology, electron beam lithography, ion beam lithography, and x-ray lithography. Although phase shifting technology can provide 0.35 micron features, it is also expensive and complicated. Further, although electron beam lithography, ion beam lithography, and x-ray lithography can provide 0.1 micron features, these techniques are currently non-standard, expensive, and complicated.

As is readily apparent, methods are needed for providing sub-photolithographic features that overcome the disadvantages of the prior art. These methods should be accurate, reproducible, scalable, and cost effective.

DETAILED DESCRIPTION OF THE DRAWINGS

In general, the present invention relates to a method for accurately forming a semiconductor device with a gate structure. That is, a method for providing a sub-photolithographic feature having precise dimensions. The method includes forming a gate structure that comprises two back-to-back conductive spacers. The gate structure is formed without relying on photolithographic techniques. Therefore, its size is smaller than the size of a gate structure formed using conventional photolithography.

The present invention can be more fully understood with reference to FIGS. 1–12, which depict highly enlarged cross-sectional views of embodiments of a graded-channel MOSFET device. The graded-channel MOSFET device is intended as a preferred example only, and as those skilled in the art will appreciate, the method according to the present invention is applicable to other designs that have small (i.e., sub-photolithographic) features requiring precise dimensions.

It should be understood that the same reference numbers are used in the figures to denote the same elements. It should be further understood that the materials, concentrations, and thicknesses provided in the description of the present invention merely serve as examples and are not limitations of the present invention. Although the present invention describes the formation of an N-channel insulated gate semiconductor device, this is not a limitation of the present invention. For example, the present invention is also suitable for forming P-channel insulated gate field effect semiconductor devices, complementary insulated gate semiconductor devices, or the like.

Figure 1:
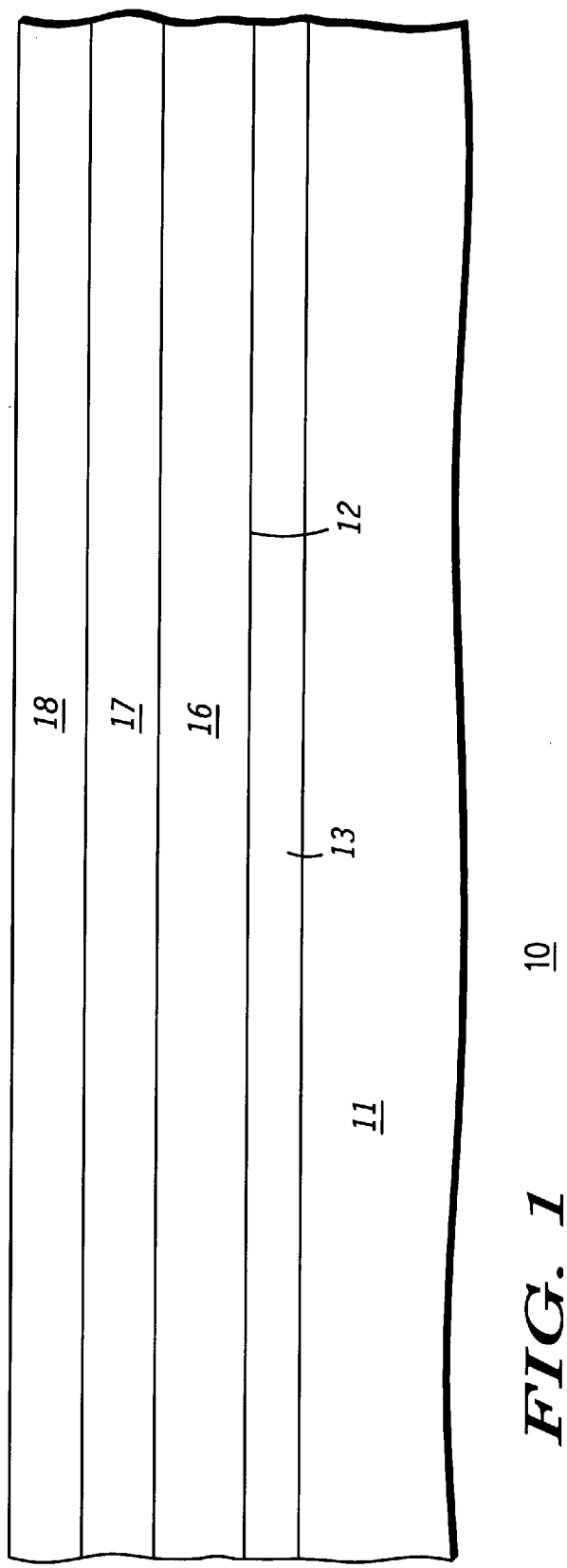
FIGS. 1–8 illustrate cross-sectional views of a semiconductor structure during manufacture in accordance with the present invention.

FIG. 1 illustrates an enlarged cross-sectional view of a semiconductor structure 10, which is a portion of a partially completed field effect transistor during processing in accordance with an embodiment of the present invention. FIG. 1 shows a semiconductor substrate or a body of semiconductor material 11 having a major surface 12 and a doped layer 13 extending from major surface 12 into substrate 11. By way of example, for an N-channel field effect transistor, semiconductor substrate 11 is silicon of P type conductivity, and doped layer 13 is of N type conductivity having a dopant concentration ranging from approximately $1 \times 10^{17}$ atoms per cubic centimeter (atoms/cm$^3$) to $1 \times 10^{20}$ atoms/cm$^3$. Doped layer 13 is an optional layer that serves as a drain extension region. Techniques for forming drain extension regions are well known to those skilled in the art.

A layer 16 of dielectric material is formed on major surface 12. Suitable techniques for forming layer 16 include thermal oxidation, chemical vapor deposition, and the like. By way of example, layer 16 has a thickness ranging between approximately 10 nanometers (nm) and approximately 200 nm. The thickness of layer 16 sets the gate-to-drain capacitance ($C_{gd}$) of a field effect transistor formed from semiconductor structure 10.

A layer 17 of conductive material is formed on layer 16. By way of example, layer 17 is polycrystalline silicon (polysilicon) or amorphous silicon formed using a chemical vapor deposition technique. A suitable thickness range for layer 17 is between approximately 50 nm and approximately 150 nm. Layer 17 serves as a buffer region to allow an overetch of a subsequently formed conductive layer, i.e., conductive layer 44 described with reference to FIG. 7. In addition, layer 17 forms part of a conductive spacer 46 described with reference to FIG. 8.

A layer 18 of dielectric material is formed on layer 17. By way of example, layer 18 is an oxide layer formed by the decomposition of tetraethyl orthosilicate and has a thickness ranging between approximately 50 nm and approximately 200 nm. An oxide layer formed by decomposition of tetraethyl orthosilicate is typically referred to as a layer of TEOS or a TEOS layer.

Figure 2:
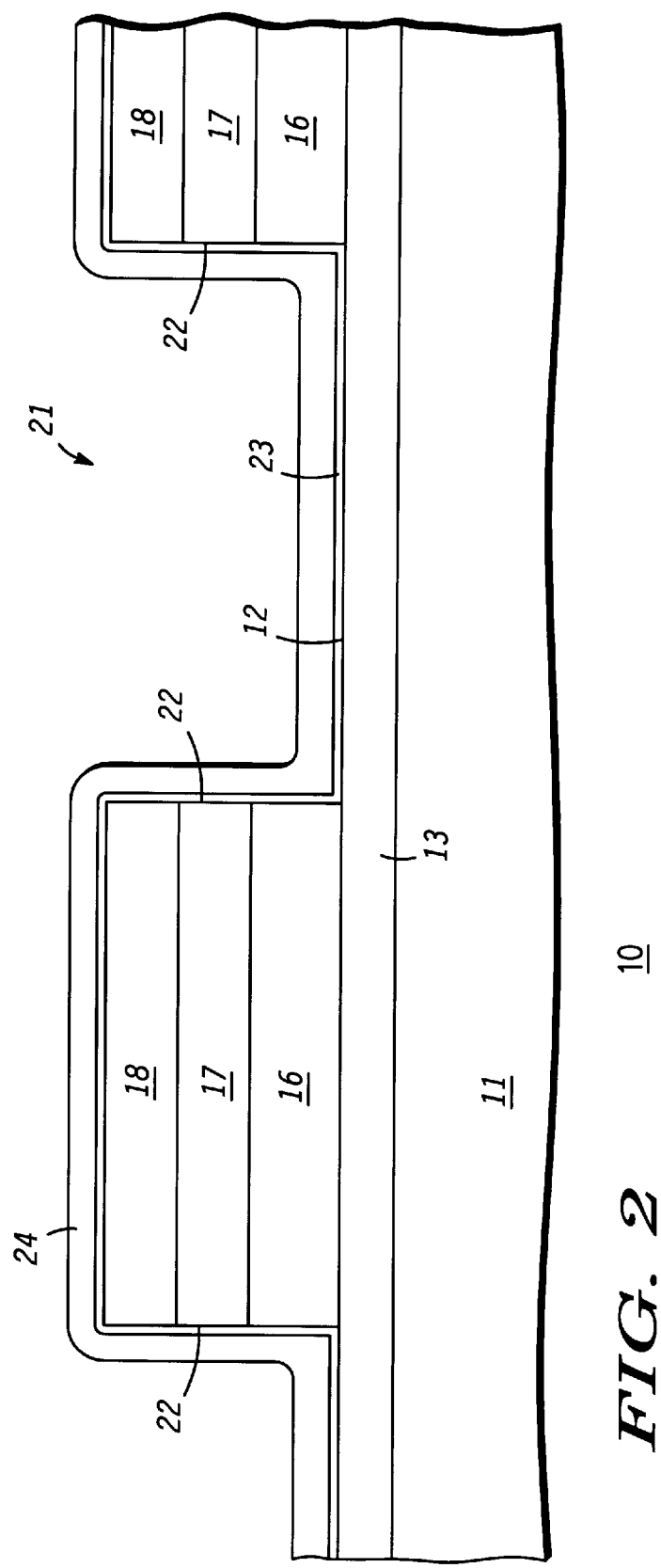

Now referring to FIG. 2, openings 21 having sidewalls 22 are formed through layers 18, 17, and 16 to expose a portion of major surface 12. In other words, layers 16, 17 and 18 are patterned to form a stack. Techniques for forming openings 21 are well known to those skilled in the art. A layer 23 of dielectric material is formed on the exposed portion of major surface 12, along sidewalls 22, and on layer 17. Layer 23 serves as a gate dielectric layer and comprises, for example, an oxide. Suitable techniques for forming layer 23 include thermal oxidation, chemical vapor deposition, and the like. Although openings 21 are shown and described as extending through layer 16, it should be understood that openings 21 may not extend completely through layer 16 but only partially through layer 16 with the remaining portion serving as the gate dielectric layer.

When semiconductor structure 10 is used in low voltage applications, (i.e., less than approximately 5.5 volts) layer 23 has a thickness ranging, for example, from approximately 5 nm to approximately 15 nm. When semiconductor structure 10 is used in high voltage applications, (i.e., higher than approximately 5.5 volts) layer 23 has a thickness ranging from approximately 15 nm to approximately 70 nm.

Optionally, a layer 24 of polysilicon is formed on gate dielectric layer 23 using, for example, a chemical vapor deposition technique. Alternatively, layer 24 comprises amorphous silicon. Layer 24 is used in embodiments where it is desirable for the channel region to have a graded doping profile. Such devices are also referred to as graded channel devices. More particularly, the thickness of layer 24 is used to control the lateral distribution of the channel region dopants rather than thermally controlling the distribution of the dopants. Thus, the accurate control of the graded channel doping profile using layer 24 helps to minimize transient enhanced diffusion effects (TED effects) due to the damage to substrate 11 that may be caused by ion implantation. Layer 24 also serves to protect gate oxide layer 23. By way of example, the thickness of layer 24 ranges between approximately 20 nm and approximately 100 nm. It should be understood that when layer 24 is not included, a uniformly doped channel is obtained.

Figure 3:
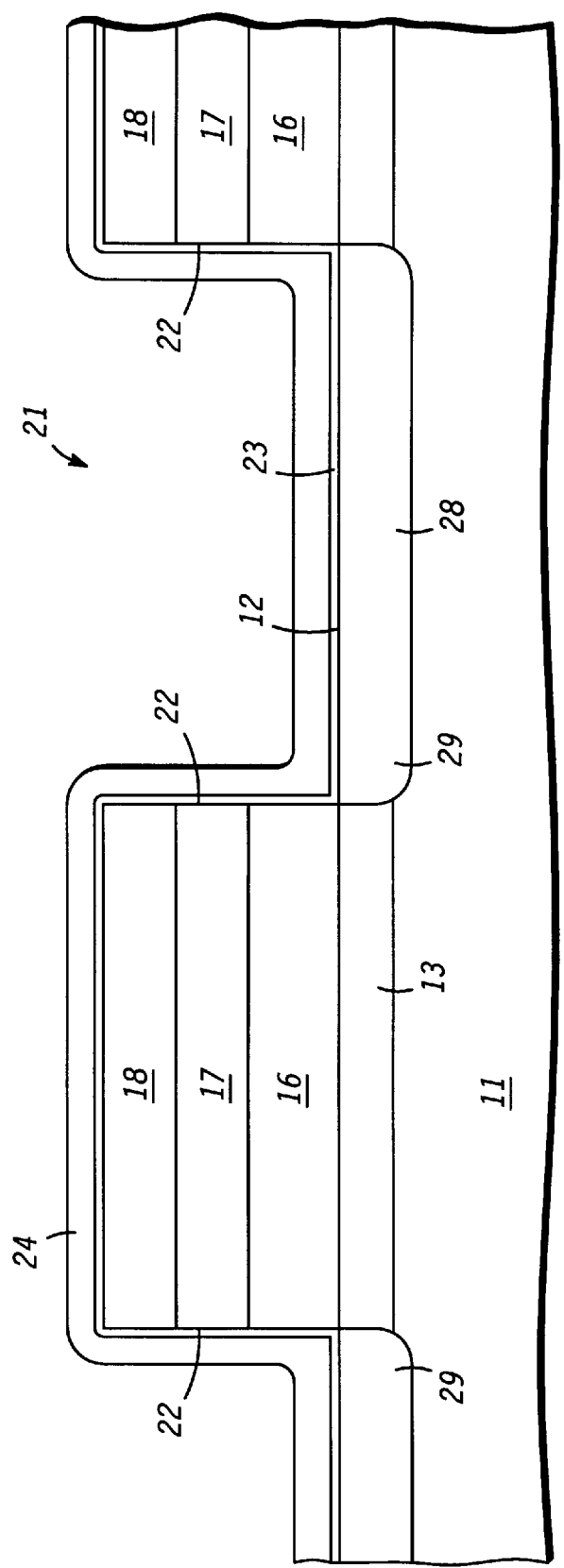

Referring now to FIG. 3, a P type dopant is implanted through layers 24 and 23, and into portions of semiconductor substrate 11 underlying openings 21. Thus, the P type dopant forms P type doped regions 28 in the portions of semiconductor substrate 11 underlying openings 21. In addition, the P type dopant forms graded channel regions 29 in the portions of regions 28 adjacent sidewalls 22. As described with reference to FIG. 2, layer 24 controls the profile of graded channel region 29. By way of example, doped regions 28 and channel regions 29 are formed by implanting the P type dopant such as, for example, boron, into semiconductor substrate 11. A suitable set of implant parameters includes implanting the boron at a dose ranging between approximately $5\times10^{12}$ ions per square centimeter (ions/cm$^2$) and $1\times10^{14}$ ions/cm$^2$ at an implant energy ranging between approximately 10 kilo-electron volts (keV) and 200 keV. Preferably the implant energy is 40 keV. It should be noted that doped regions 28 can be formed using multiple implants rather than a single implant. When using multiple implants, a first implant can be used to form graded channel regions 29 and a second implant can be used to prevent punch-through.

Figure 4:
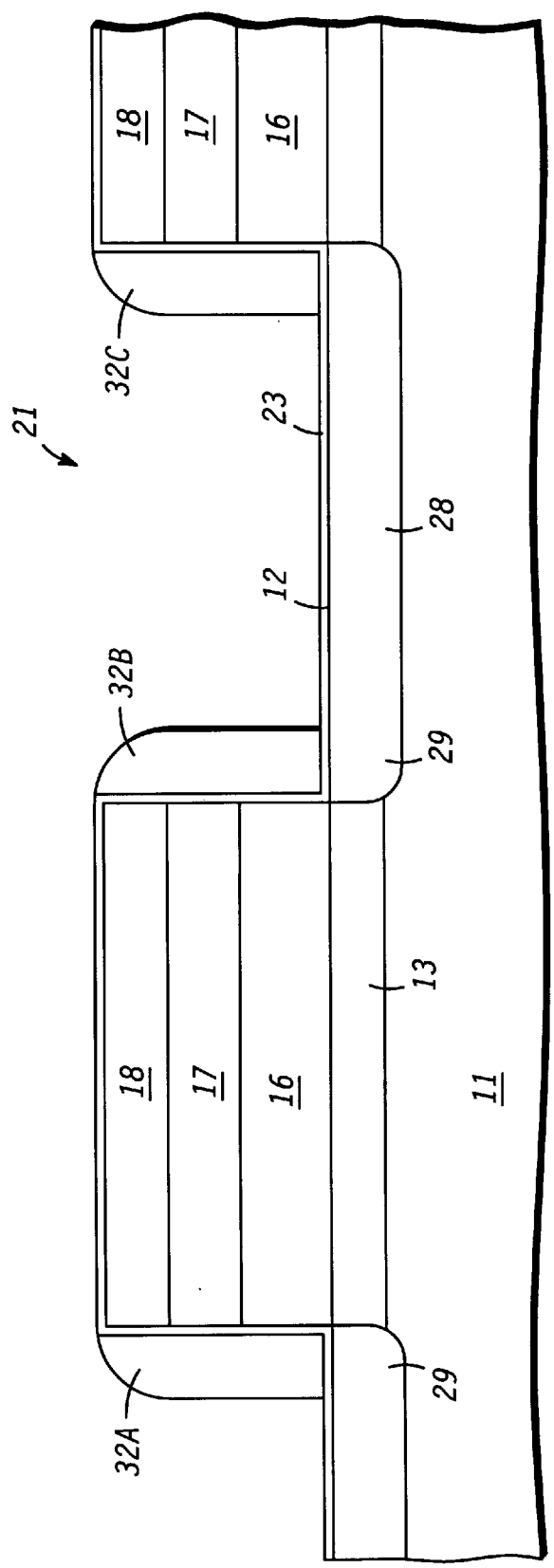

Now referring to FIG. 4, a layer of conductive semiconductor material (not shown) such as, for example, polysilicon or amorphous silicon, is formed on layer 24 using techniques known to those skilled in the art. By way of example, the layer of conductive semiconductor material is formed using a chemical vapor deposition technique and has a thickness of approximately 200 nm. The layer of conductive semiconductor material (not shown) and layer 24 (shown in FIG. 3) are anisotropically etched to form conductive spacers 32A, 32B, and 32C. It should be noted that conductive spacers 32A, 32B, and 32C are formed by the remaining portions of the layer of conductive semiconductor material and layer 24. It should be further noted that the exposed portions of gate dielectric layer 23 are thinned during the formation of conductive spacers 32A, 32B, and 32C. The thicknesses of the layer of conductive semiconductor material and layer 24 control the width of conductive spacers 32A, 32B, and 32C, which in turn controls the effective channel length of field effect transistors formed from semiconductor structure 10.

Figure 5:
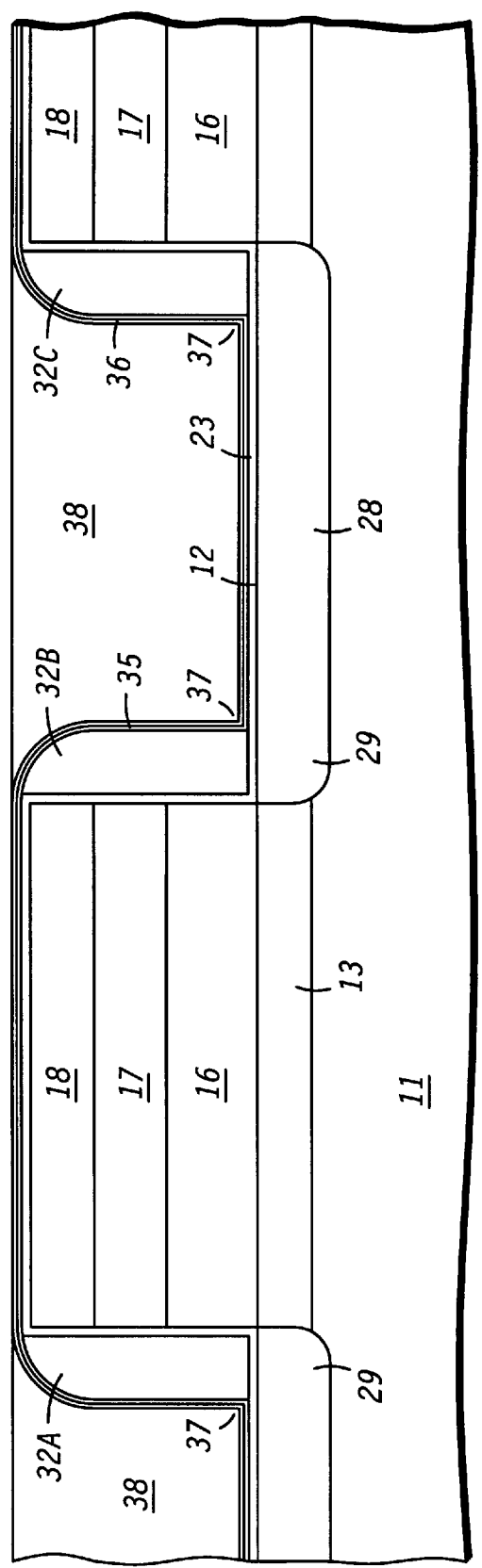

Now referring to FIG. 5, a continuous layer of material is formed over substrate 11 and planarized using conventional techniques to fill openings 21. The continuous layer of material comprises one or more layers where the layers are the same or different materials For example, the continuous layer of material comprises a layer 35 of oxide, a layer 36 of nitride, and a layer 38 of planarization material.

Layer 35 of oxide such as, for example, a TEOS layer, is formed over dielectric layer 18, conductive spacers 32A, 32B, and 32C, and exposed portions of gate dielectric layer 23. Layer 36 of nitride is deposited over layer 35. By way of example, the thickness of layer 35 ranges between approximately 10 and approximately 20 nm and the thickness of nitride layer 36 ranges between approximately 10 nm and approximately 40 nm. Layer 36 protects the gate dielectric layer 23 in regions 37, i.e., the corners formed by the intersections of conductive spacers 32A–32C and the exposed portion of gate dielectric layer 23, from being etched. Layer 38 of planarization material is formed on layer 36 and fills openings 21 (shown in FIG. 4). The planarization material may be oxide, nitride, combinations thereof, or the like.

When layer 38 of planarization material is formed, it is typically non-planar and extends above layers 18 and 36. Accordingly, it is planarized using techniques well known to those skilled in the art. The planarization process can also remove the portion of nitride layer 36 on dielectric layer 18. Alternatively, a separate etch may be used to remove the portion of nitride layer 36 on dielectric layer 18.

Figure 6:
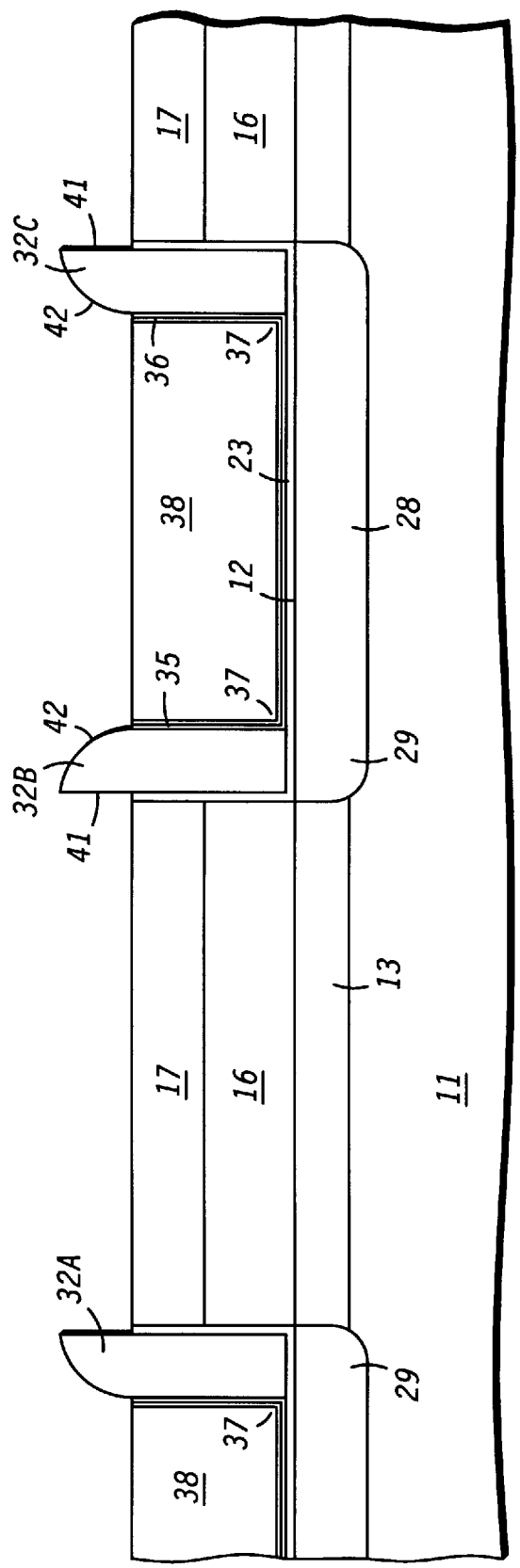

Now referring to FIG. 6, remaining portions of layer 18 (shown in FIG. 5) and portions of layers 35 and 23 on layer 18 are removed using techniques well known to those skilled in the art. In addition, a portion of layer 38 filling opening 21 (shown in FIG. 5) may be removed. An important feature of the present invention is shaping conductive spacers 32A, 32B, and 32C such that each has a sloped sidewall 41 and a substantially vertical sidewall 42. This shaping permits the formation of additional conductive spacers as described with reference to FIG. 8.

Figure 7:
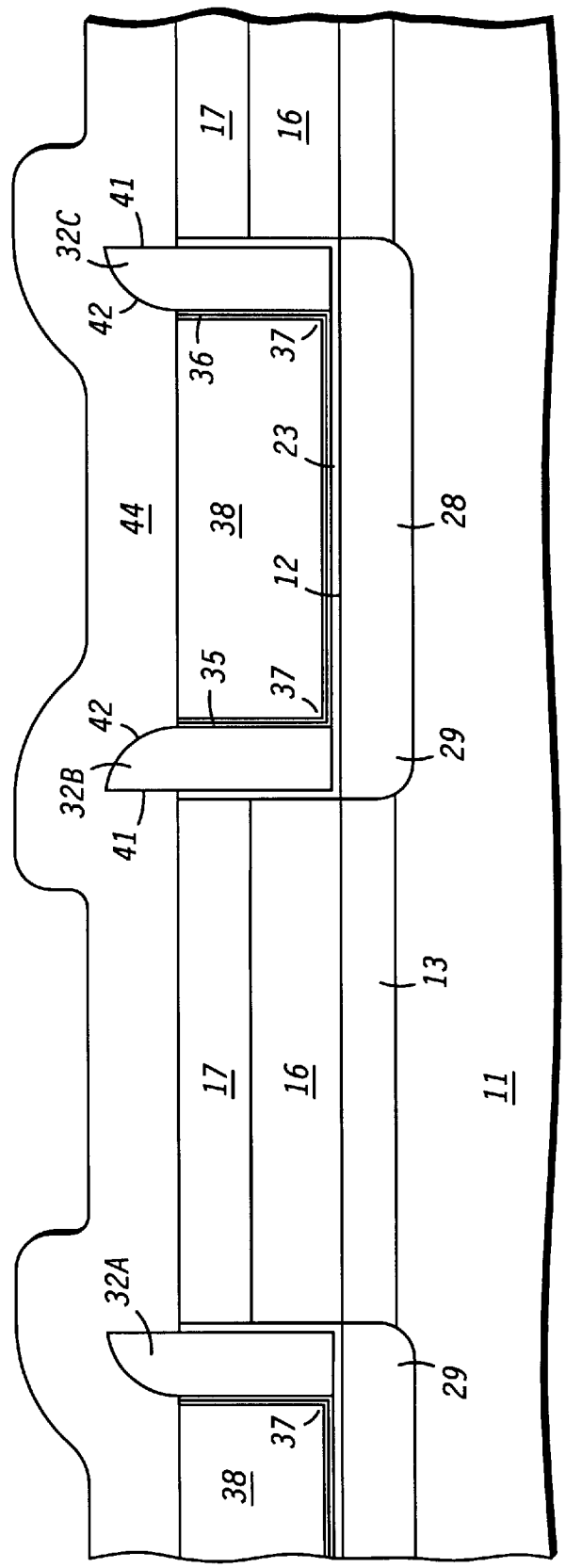

Now referring to FIG. 7, a layer 44 of semiconductor material such as, for example, polysilicon or amorphous silicon, is formed on layer 17, conductive spacers 32A, 32B, and 32C, along sidewalls 41 and 42, and on layer 38. By way of example, layer 44 is a conformal layer having a thickness ranging from approximately 100 nm to approximately 300 nm. Optionally, an implant is performed to dope layer 44. Such implanted dopant can diffuse from layer 44 into conductive spacers 32A, 32B, and 32C, and polysilicon layer 17 during subsequent processing.

Figure 8:
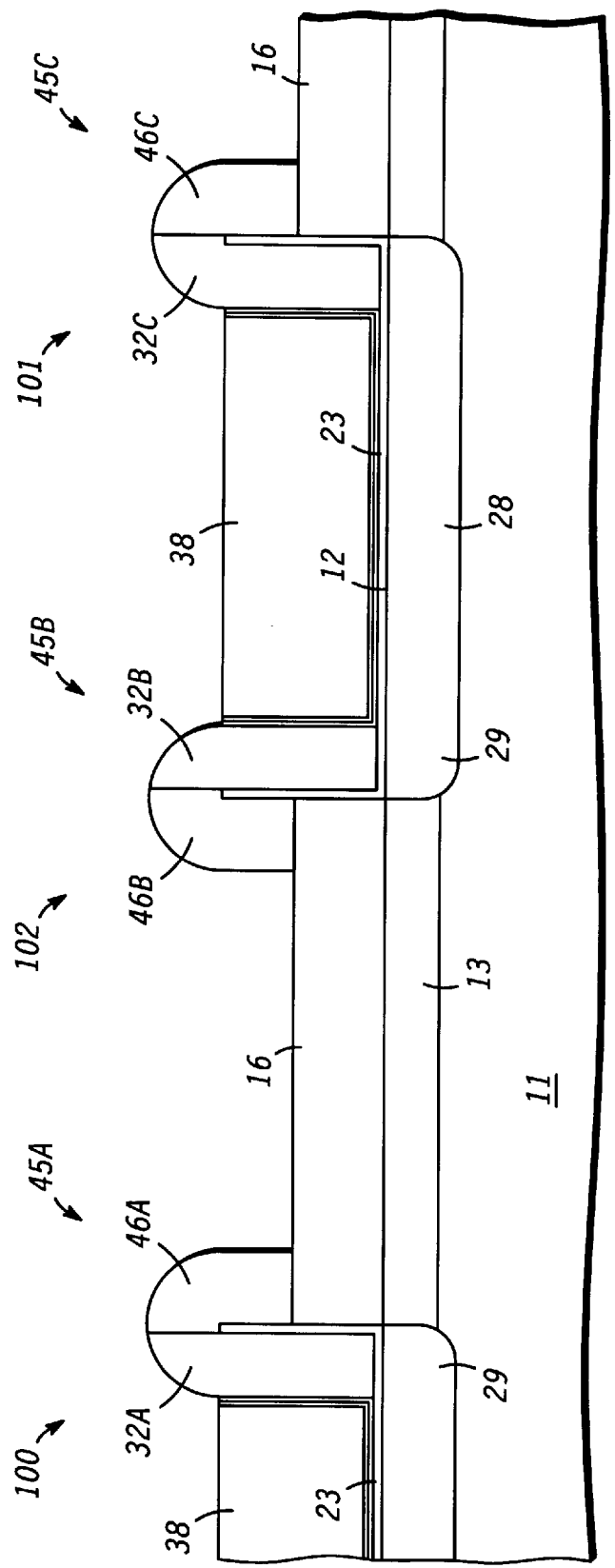

Referring now to FIG. 8, layer 44 is anisotropically etched to form spacers 46A, 46B, and 46C. Further, portions of layer 17 adjacent spacers 46A, 46B, and 46C are removed, thereby exposing portions of dielectric layer 16 adjacent spacers 46A, 46B, and 46C. Layer 38 is also exposed. Dielectric layer 16 and layer 38 serve as etch stop layers.

At this point, gate structures 45A, 45B, and 45C have been formed, wherein each gate structure is comprised of back-to-back or adjacent conductive spacers (32A–32C, 46A–46C), a portion of layer 16, and a portion of layer 23. More particularly, gate structure 45A is comprised of conductive spacers 32A, 46A, and portions of layers 16 and 23; gate structure 45B is comprised of conductive spacers 32B, 46B, and portions of layers 16 and 23; and gate structure 45C is comprised of conductive spacers 32C, 46C, and portions of layers 16 and 23. The portions of layer 16 are preferably thicker than the portions of layer 23 and serve to decrease the gate-to-drain capacitance of the insulated gate field effect transistor formed from semiconductor structure 10. Accordingly, the method of the present invention provides double spacer gate structures 45A, 45B, and 45C having sub-photolithographic features and dimensions defined without relying on conventional photolithographic techniques or alternative method provided in the prior art, which are non-standard, expensive, and complicated.

Figure 9:
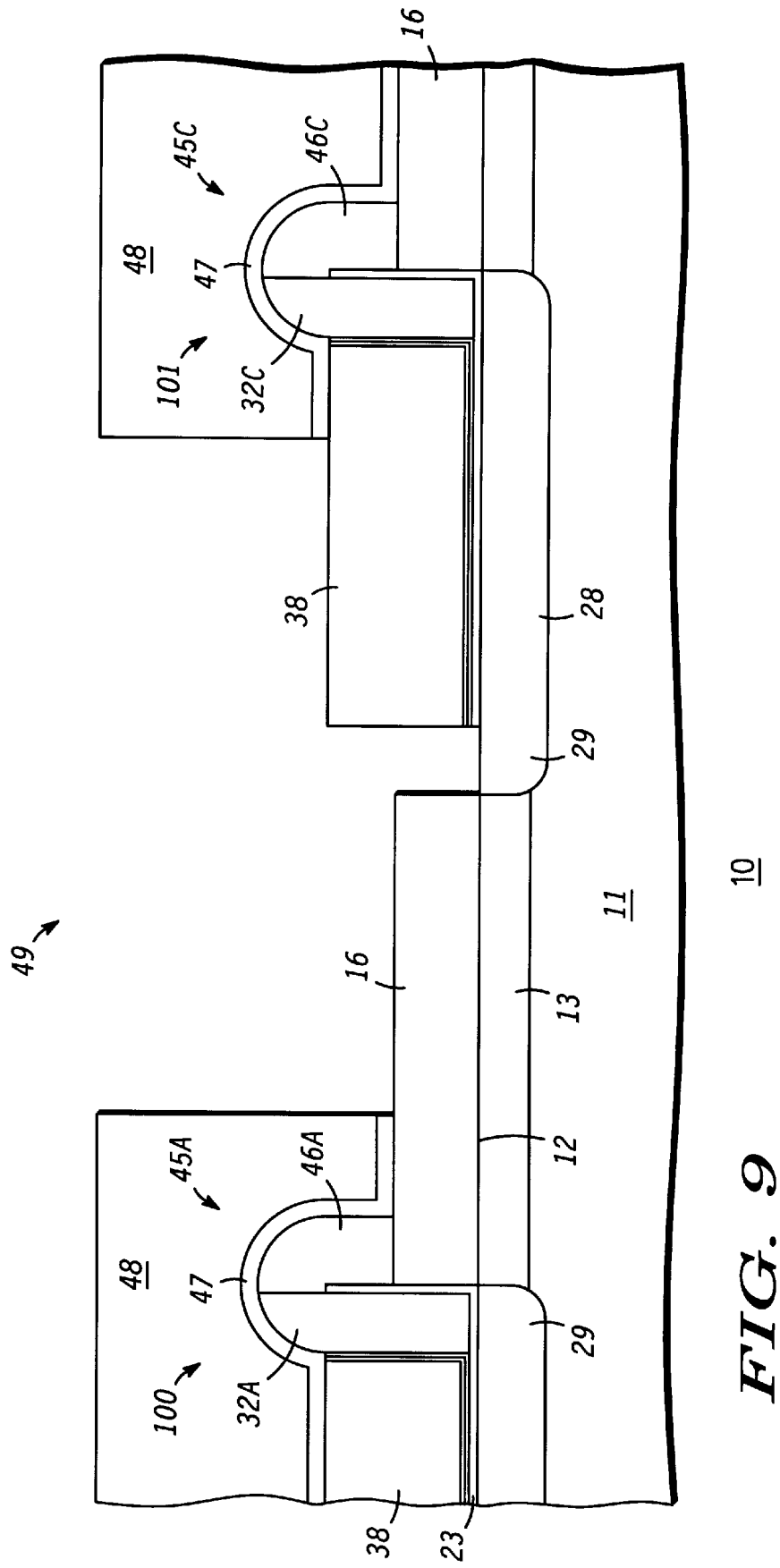
FIGS. 9–11 are cross-sectional views illustrating insulated gate semiconductor devices during manufacture in accordance with a first embodiment of the present invention.
Figure 10:
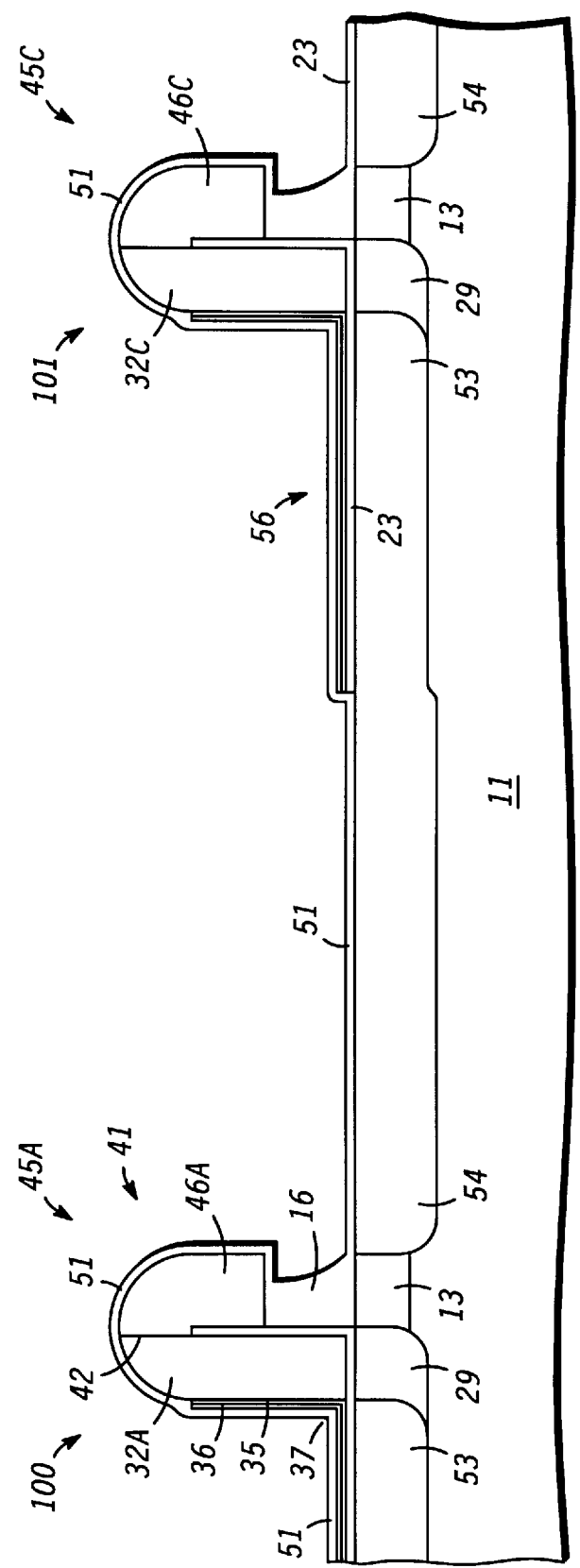
Figure 11:
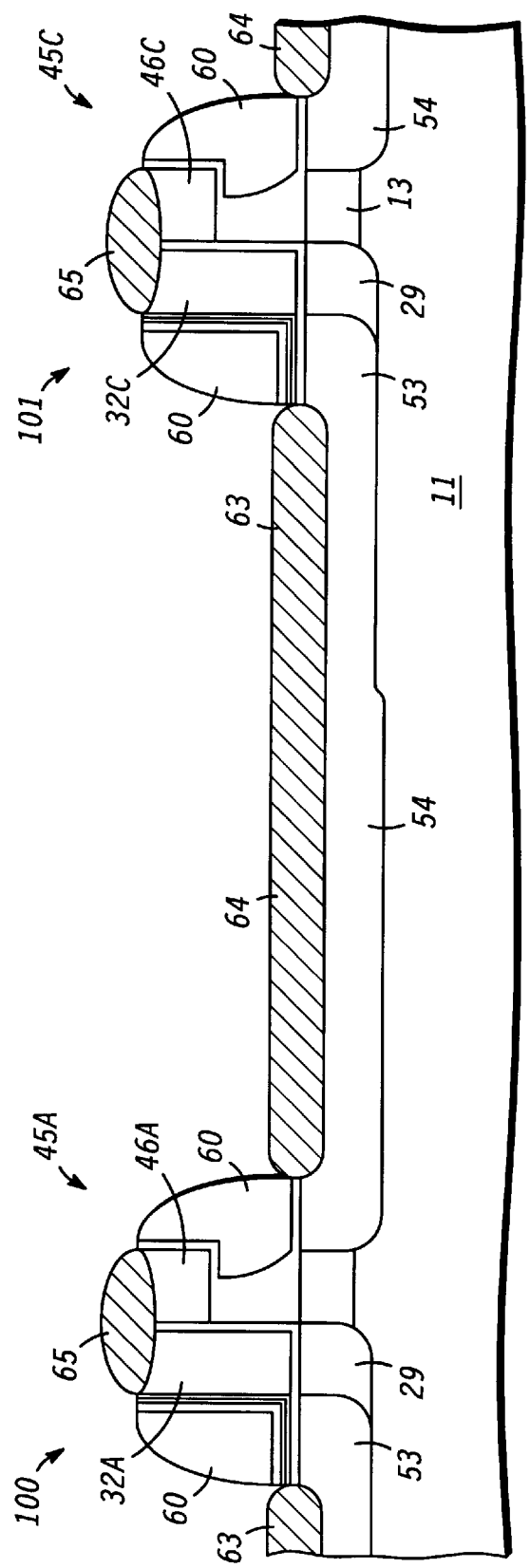
Figure 12:
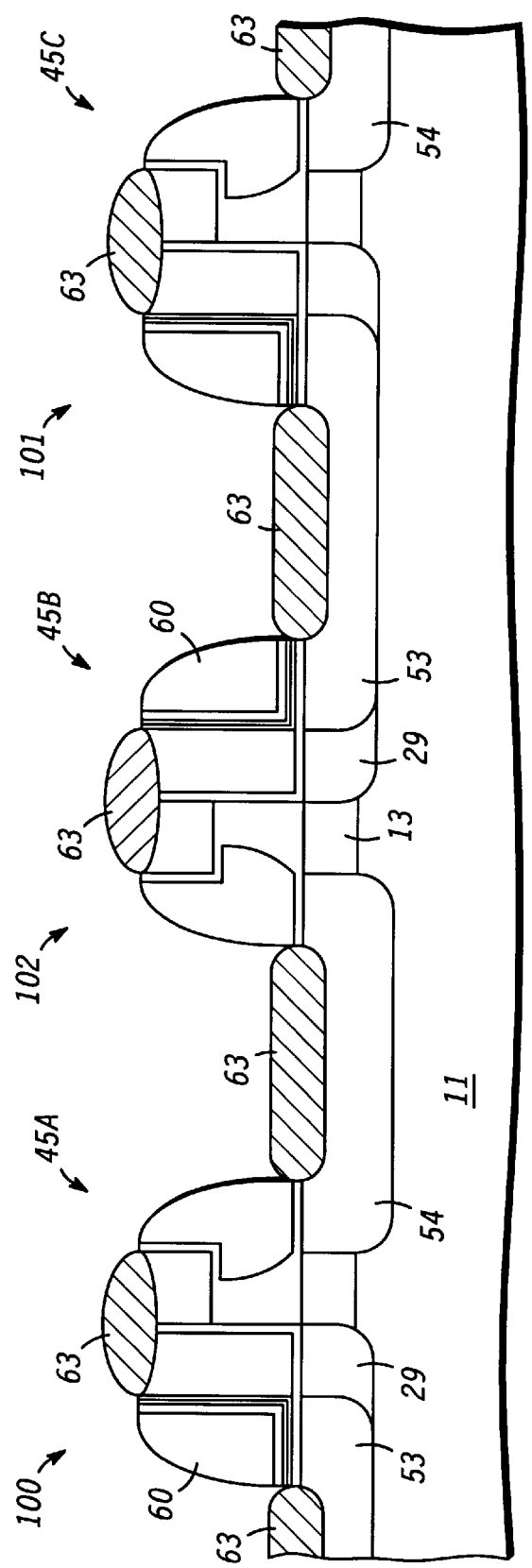
FIG. 12 is a cross-sectional view illustrating insulated gate semiconductor devices during manufacture in accordance with a second embodiment of the present invention.

FIGS. 1–8 illustrate a method for fabricating an insulated gate semiconductor device structure that can be used in various circuit designs. For example, FIGS. 9–11 illustrate the use of structure 10 of FIG. 8 to form a NAND gate and FIG. 12 illustrates a NOR gate implementation. The description of the fabrication of NAND and NOR gates from the structure of FIG. 8 merely serve as examples, and other circuit configurations can be generated from this structure.

FIGS. 9–11 are cross-sectional views illustrating an insulated gate semiconductor devices 100 and 101 during processing. Referring now to FIG. 9, a layer 47 of TEOS is formed on layer 16, gate structures 45A, 45B, and 45C, and layer 38 of FIG. 8. By way of example, layer 47 is continuous and has a thickness ranging from approximately 10 nm to approximately 150 nm and is preferably 50 nm. In accordance with a NAND gate implementation, gate structure 45B is removed. More particularly, a layer 48 of photoresist is formed over layer 47 and subsequently patterned to form an opening 49. Opening 49 exposes the portion of layer 47 over conductive spacers 32B and 46B, i.e., over gate structure 45B. Multiple etches are performed to remove the exposed portions of layer 47, conductive spacers 32B and 46B, nitride layer 36, and layer 38 above the corresponding graded channel region 29. In addition, the etch processes thin the exposed portions of dielectric layer 16 and gate dielectric layer 23. Layer 48 of photoresist is removed after the etching processes.

Referring now to FIG. 10, layer 47 and dielectric layer 16 are removed using techniques well known to those skilled in the art. It should be noted that portions of dielectric layer 16 under conductive spacers 46A and 46C are not removed, although some undercutting may occur. It should also be noted that portions of gate oxide layer 23 under conductive spacers 32A and 32C are protected by layer 36 of nitride from being etched. A layer 51 of dielectric material is formed over semiconductor devices 100 and 101. A source/drain implant is performed to form source regions 53 and drain regions 54. In addition, the source/drain implant dopes gate structures 45A and 45C. A suitable set of implant parameters for the source/drain implant includes implanting an N type dopant such as, for example, arsenic, at a dose ranging from approximately $5 \times 10^{13}$ atoms/cm$^2$ to approximately $8 \times 10^{15}$ atoms/cm$^2$ and an energy ranging from approximately 20 to approximately 90 keV for a single implant. Alternatively, a multiple implant process can be used. In accordance with the present invention, source regions 53 and drain regions 54 are self-aligned to gate structures 45A and 45C. Because gate structures 45A and 45C have dimensions that are smaller than can be achieved using conventional photolithography, the effective channel lengths of semiconductor devices 100 and 101 are much smaller than can achieved using conventional photolithography.

In a preferred embodiment, an extension 56 adjacent spacers 32A and 32C results from the pattern used to form opening 49 (shown in FIG. 9) and the overetch of layer 36. Extension 56 is comprised of portions of layers 51, 36, and 35, and gate dielectric layer 23. Extension 56 alters or controls the dopant profile adjacent conductive spacers 32A and 32C by reducing the depth of the source junction to provide a device that has a reduced sub-threshold leakage current when the source region is used as a drain and the drain region is used as a source, i.e., when the source and drains are switched. In addition, the shallower junction depths of source regions 53 reduce the short channel effects of devices 100 and 101.

Referring now to FIG. 11, a thermal activation is performed, preferably using rapid thermal annealing (RTA) at a temperature ranging from approximately 1000 degrees Celsius (°C.) to approximately 1100° C. for a period of approximately 20 seconds to approximately 120 seconds. A nitride layer is deposited over the gate structures 45A and 45C, source regions 53 and drain regions 54. The nitride layer is subsequently etched to form nitride spacers 60. The portion of extension 56 unprotected by nitride spacers 60 is removed during the spacer overetch. A silicide pre-clean is performed to remove dielectric layer 51 to expose the source regions 53, drain regions 54, and gate structures 45A and 45C. A silicide is formed in the source regions 53, drain regions 54, and gate structures 45A and 45C using conventional silicidation techniques. The silicide forms conductive regions 63 contacting source regions 53, drain regions 54, and gate structures 45A and 45C.

FIG. 12 is a cross-sectional view illustrating insulated gate semiconductor devices 100, 101, and 102 in an implementation of parallel devices for a NOR logic circuit configuration. To achieve the NOR gate implementation, the process steps illustrated in FIG. 9 are not performed, thereby leaving gate structure 45B (shown in FIG. 8) intact.

By now it should be appreciated that an insulated gate semiconductor device and a method for manufacturing the device that overcome the problems and limitations of the prior art have been provided. Using the method of the present invention, an insulated gate semiconductor device having sub-photolithographic features and dimensions can be accurately and reproducibly manufactured. Furthermore, the present invention provides a cost effective manufacturing process that is compatible with standard techniques used in the current fabrication processes.

We claim:

1. A method for manufacturing an insulated gate semiconductor device, comprising the steps of:

providing a semiconductor substrate of a first conductivity type and having a major surface;

forming a gate structure above the major surface, the gate structure comprising a first conductive spacer on a gate dielectric layer and a second conductive spacer on a first dielectric layer, the gate dielectric layer and the first dielectric layer being disposed on the major surface, and wherein the first dielectric layer is thicker than the gate dielectric layer; and forming first and second doped regions adjacent to the gate structure, wherein the first and second doped regions are of a second conductivity type.

2. The method of claim 1, further including the step of doping the semiconductor substrate with a dopant of the second conductivity type before the step of forming the gate structure.

3. The method of claim 1, further including the step of doping a portion of the semiconductor substrate with a dopant of the first conductivity type, wherein the portion of the semiconductor substrate is below a portion of the first conductive spacer.

4. The method of claim 1, wherein the step of forming the gate structure comprises the steps of:

forming the first dielectric layer over the major surface;

forming a first conductive layer over the first dielectric layer;

forming a second dielectric layer over the first conductive layer;

forming an opening through the second dielectric layer, the first conductive layer, and into the first dielectric layer;

forming the gate dielectric layer within the opening;

forming a second conductive layer over the second dielectric layer and within the opening;

forming the first conductive spacer from the second conductive layer;

forming a protective layer over the first conductive spacer and over a portion of the gate dielectric layer;

filling the opening with a third dielectric layer;

removing exposed portions of the protective layer and the second dielectric layer;

forming a third conductive layer over the semiconductor substrate;

forming the second conductive spacer from at least a portion of the first conductive layer; and removing exposed portions of the third dielectric layer and the first dielectric layer.

5. The method of claim 4, wherein the step of forming the protective layer comprises forming the protective layer comprising one of a silicon oxide and a silicon nitride.

6. The method of claim 4, wherein the step of forming the gate dielectric layer comprises the steps of:

forming the opening through the first dielectric layer to expose a portion of the major surface;

growing a sacrificial oxide on the exposed portion of the major surface;

removing the sacrificial oxide; and growing a gate oxide on the exposed portion of the major surface.

7. The method of claim 4, wherein the step of forming the second conductive layer comprises the steps of:

forming a first polycrystalline silicon layer over the second dielectric layer and within the opening; and forming a second polycrystalline silicon layer over the first polycrystalline silicon layer.

8. The method of claim 7, further comprising the step of forming a third doped region in the semiconductor substrate through the opening before the step of forming the second polycrystalline silicon layer, wherein the third doped region is of the first conductivity type.

9. The method of claim 1, wherein the step of forming the gate structure includes forming the gate structure wherein the first and second conductive spacers comprise a material selected from a group consisting of polycrystalline silicon and amorphous silicon.

10. The method of claim 1, wherein the step of forming the gate structure includes forming the gate structure wherein the first and second conductive spacers are positioned back-to-back.

11. A process for forming an insulated gate semiconductor device having a double spacer gate structure comprising the steps of:

forming a first dielectric layer over a major surface of a body of semiconductor material, the body of semiconductor material having a first conductivity type;

forming a first layer of semiconductor material over the first dielectric layer;

forming a second dielectric layer over the first layer of semiconductor material;

forming an opening in the second dielectric layer, the first layer of semiconductor material, and the first dielectric layer;

forming a gate dielectric layer within the opening;

forming a second layer of semiconductor material over the body of semiconductor material;

forming a first spacer from the second layer of semiconductor material within the opening;

forming a continuous layer of material over the body of semiconductor material;

removing portions of the continuous layer of material and the second dielectric layer to expose the first layer of semiconductor material and a portion of the first spacer;

forming a third layer of semiconductor material over the body of semiconductor material;

forming a second spacer from the third layer of semiconductor material, wherein the first and second spacers form the double spacer gate structure;

removing portions of the first dielectric layer and the continuous layer of material; and doping the double spacer gate structure and portions of the body of semiconductor material with a second conductivity type dopant to form first and second doped regions aligned to the double spacer gate structure.

12. The process of claim 11, wherein the step of forming the second layer of semiconductor material includes the steps of:

forming a first silicon layer over the body of semiconductor material; and forming a second silicon layer over the body of semiconductor material.

13. The process of claim 12, further comprising the step of forming a third doped region in the body of semiconductor material before the step of forming the second silicon layer, wherein the third doped region is of the first conductivity type.

14. The process of claim 12, wherein the step of forming the continuous layer of material comprises the steps of:

forming a first oxide layer over the body of semiconductor material;

forming a nitride layer over the first oxide layer; and forming a second oxide layer over the nitride layer.

15. The process of claim 14, wherein the step of removing portions of the first dielectric layer and the continuous layer of material includes leaving a portion of the nitride layer and the first oxide layer adjacent one side of the double spacer gate structure to provide an extension for dopant profile control.

16. A method for forming a semiconductor device having a double spacer gate structure comprising the steps of:

forming a stack structure over a major surface of a body of semiconductor material, the body of semiconductor material having a first conductivity type, the stack structure having a sidewall;

forming a gate dielectric layer over the major surface adjacent the stack structure;

forming a first layer of semiconductor material over the gate dielectric layer and the stack structure;

forming a first spacer from the first layer of semiconductor material adjacent the sidewall;

removing a portion of the stack structure to form a substantially vertical sidewall along the first spacer;

forming a second layer of semiconductor material over the body of semiconductor material;

forming a second spacer from the second layer of semiconductor material adjacent the substantially vertical sidewall, wherein the first and second spacers form the double spacer gate structure; and doping the double spacer gate structure and portions of the body of semiconductor material with a second conductivity type dopant to form first and second doped regions aligned to the double spacer gate structure.

17. The method of claim 16, wherein the step of forming the stack structure includes the steps of:

forming a first dielectric layer over the major surface;

forming a third layer of semiconductor material over the first dielectric layer;

forming a second dielectric layer over the third layer of semiconductor material; and patterning the second dielectric layer, the third layer of semiconductor material, and the first dielectric layer to form the stack structure.

* * * * *